(12) United States Patent
Kim

(10) Patent No.: US 8,102,708 B2
(45) Date of Patent: Jan. 24, 2012

(54) FLASH MULTI-LEVEL THRESHOLD DISTRIBUTION SCHEME

(75) Inventor: Jin-Ki Kim, Ottawa (CA)

(73) Assignee: MOSAID Technologies Incorporated, Ottawa, Ontario (CA)

(*) Notice: Subject to any disclaimer, the term of this patent is extended or adjusted under 35 U.S.C. 154(b) by 0 days.

(21) Appl. No.: 12/884,939

(22) Filed: Sep. 17, 2010

(65) Prior Publication Data

US 2011/0007564 A1    Jan. 13, 2011

Related U.S. Application Data

(63) Continuation of application No. 12/463,759, filed on May 11, 2009, now Pat. No. 7,821,827, which is a continuation of application No. 11/762,330, filed on Jun. 13, 2007, now Pat. No. 7,593,259.

(60) Provisional application No. 60/844,154, filed on Sep. 13, 2006.

(51) Int. Cl.
    *G11C 11/34* (2006.01)
(52) U.S. Cl. ............... 365/185.03; 365/185.24
(58) Field of Classification Search ............. 365/185.03, 365/185.24
    See application file for complete search history.

(56) References Cited

U.S. PATENT DOCUMENTS

| | | | |
|---|---|---|---|
| 5,109,361 A | 4/1992 | Yim et al. |
| 5,299,162 A | 3/1994 | Kim et al. |
| 5,396,459 A | 3/1995 | Arakawa |
| 5,473,563 A | 12/1995 | Suh et al. |
| 5,541,879 A | 7/1996 | Suh et al. |
| 5,546,341 A | 8/1996 | Suh et al. |
| 5,671,178 A | 9/1997 | Park et al. |
| 5,732,018 A | 3/1998 | Choi et al. |
| 5,835,935 A | 11/1998 | Estakhri et al. |
| 5,912,844 A | 6/1999 | Chen et al. |
| 5,937,425 A | 8/1999 | Ban |
| 5,953,255 A | 9/1999 | Lee |
| 5,995,417 A | 11/1999 | Chen et al. |

(Continued)

FOREIGN PATENT DOCUMENTS

KR    20070057716 A    6/2007

OTHER PUBLICATIONS

Samsung Electronics Co., Ltd., "Samsung Announces First 40-nanometer Device—32 Gb NAND Flash with Revolutionary Charge Trap", World Press Release, Sep. 11, 2006, pp. 1-2.

(Continued)

*Primary Examiner* — Michael Tran
(74) *Attorney, Agent, or Firm* — Shin Hung; Borden Ladner Gervais LLP

(57) ABSTRACT

A threshold voltage distribution scheme for multi-level Flash cells where an erase threshold voltage and at least one programmed threshold voltage lie in an erase voltage domain. Having at least one programmed threshold voltage in the erase voltage domain reduces the Vread voltage level to minimize read disturb effects, while extending the life span of the multi-level Flash cells as the threshold voltage distance between programmed states is maximized. The erase voltage domain can be less than 0V while a program voltage domain is greater than 0V. Accordingly, circuits for program verifying and reading multi-level Flash cells having a programmed threshold voltage in the erase voltage domain and the program voltage domain use negative and positive high voltages.

2 Claims, 13 Drawing Sheets

U.S. PATENT DOCUMENTS

| | | | |
|---|---|---|---|
| 6,111,787 | A | 8/2000 | Akaogi et al. |
| 6,118,705 | A | 9/2000 | Gupta et al. |
| 6,128,224 | A | 10/2000 | Morton et al. |
| 6,154,391 | A | 11/2000 | Takeuchi et al. |
| 6,208,556 | B1 | 3/2001 | Akaogi et al. |
| 6,256,254 | B1 | 7/2001 | Kwak et al. |
| 6,278,636 | B1 | 8/2001 | Lee |
| 6,359,810 | B1 | 3/2002 | Gupta et al. |
| 6,456,528 | B1 | 9/2002 | Chen |
| 6,522,580 | B2 | 2/2003 | Chen et al. |
| 6,552,580 | B2 | 4/2003 | Nilson et al. |
| 6,594,183 | B1 | 7/2003 | Lofgren et al. |
| 6,671,204 | B2 | 12/2003 | Im |
| 6,717,857 | B2 | 4/2004 | Byeon et al. |
| 6,732,221 | B2 | 5/2004 | Ban |
| 6,763,424 | B2 | 7/2004 | Conley |
| 6,804,148 | B2 | 10/2004 | Bedarida et al. |
| 6,807,103 | B2 | 10/2004 | Cavaleri et al. |
| 6,870,773 | B2 | 3/2005 | Noguchi et al. |
| 6,885,583 | B2 | 4/2005 | Tanaka |
| 6,947,331 | B1 | 9/2005 | Mirgorodski et al. |
| 6,958,938 | B2 | 10/2005 | Noguchi et al. |
| 6,963,509 | B1 | 11/2005 | Ju |
| 7,016,229 | B2 | 3/2006 | Kim |
| 7,042,770 | B2 | 5/2006 | Lee et al. |
| 7,046,554 | B2 | 5/2006 | Lee |
| 7,061,813 | B2 | 6/2006 | Lee |
| 7,082,056 | B2 | 7/2006 | Chen et al. |
| 7,099,213 | B2 | 8/2006 | Ju |
| 7,149,130 | B2 | 12/2006 | Lee |
| 2003/0235080 | A1 | 12/2003 | Yaegashi et al. |
| 2004/0080979 | A1 | 4/2004 | Park |
| 2004/0105310 | A1 | 6/2004 | Arai et al. |
| 2004/0179403 | A1* | 9/2004 | Noguchi et al. ......... 365/185.22 |
| 2005/0157558 | A1 | 7/2005 | Noguchi et al. |
| 2005/0232008 | A1 | 10/2005 | Shukuri et al. |
| 2005/0276120 | A1 | 12/2005 | Hsia et al. |
| 2006/0034128 | A1 | 2/2006 | Han et al. |
| 2006/0133155 | A1* | 6/2006 | Fujita et al. ............. 365/185.29 |
| 2008/0062762 | A1 | 3/2008 | Doyle |

OTHER PUBLICATIONS

Aritome, S. et al., "A Reliable Bi-Polarity Write/Erase Technology in Flash EEPROMS", Int'l. Electron Devices Meeting, 1990, Technical Digest, Dec. 9-12, 1990, pp. 111-114.

Shirota, R., et al., "A 2.3um2 Memory Cell Structure for 16Mb NAND EEPROMs", International Electron Devices Meeting 1990, Technical Digest, Dec. 1990, pp. 103-106.

Jung, et al., "A 3.3V 128Mb Multi-Level NAND Flash Memory for Mass Storage Applications", 1996 IEEE International Solid-State Circuits Conference, Digest of Technical Papers, Feb. 1996, pp. 32-33.

Hara, T. et al., "A 146mm2 8Gb NAND Flash Memory with 70nm CMOS Technology", ISSCC Session 2 Non-Volatile Memory 2.1, IEEE International Solid-State Circuits Conference, Feb. 2005, pp. 44, 45 and 584.

Byeon, D. et al., "An 8Gb Multi-Level NAND Flash Memory with 63nm STI CMOS Process Technology", ISSCC Session 2 Non-Volatile Memory 2.2, IEEE International Solid-State Circuits Conference, Feb. 2005, pp. 46 and 47.

Suh, K. et al., "A 3.3 V 32 Mb NAND Flash Memory with Incremental Step Pulse Programming Scheme", IEEE Journal of Solid-State Circuits, vol. 30, No. 11, Nov. 1995, pp. 1149-1156.

Takeuchi, K. et al., "A multipage cell architecture for high-speed programming multilevel NAND flash memories", IEEE Journal of Solid-State Circuits, vol. 33, Issue 8, Aug. 1998, pp.1228-1238.

Jung, T. et al., "A 117-mm2 3.3-V Only 128-Mb Multilevel NAND Flash Memory for Mass Storage Applications," IEEE Journal of Solid-State Circuits, vol. 31, No. 11, Nov. 1996, pp. 1575-1583.

Cho, T. et al., "A Dual Mode NAND Flash Memory: 1-Gb Multilevel and High-Performance 512-Mb Single-Level Modes", IEEE Journal of Solid-State Circuits, vol. 36, No. 11, Nov. 2001, pp. 1700-1706.

Lee, Seungjae et al., "A 3.3V 4 Gb Four-Level NAND Flash Memory with 90nm CMOS Technology", ISSCC 2004 / Session; 2 / Non-Volatile Memory / 2.72004 IEEE International Solid-State Circuits Conference 0-7803-8267-6/ ©2004 IEEE, Feb. 16, 2004, 10 pages.

Takeuchi, K. et al, "A 56nm CMOS 99mm2 8Gb Multi-level NAND Flash Memory with 10MB/s Program Throughput", Solid-State Circuits, 2006 IEEE International Conference Digest of Technical Papers, Feb. 6, 2006, ISBN: 1-4244-0079-1, 10 pages.

Kirisawa, et al., A Nand Structured Cell With a New Programming Technology for Highly Reliable 5V-Only Flash Eeprom, 1990 IEEE Symposium on VLSI Tech., Jun. 4-7, 1990, pp. 129-130.

Cho, et al., "A 3.3 V 1 Gb multi-level NAND flash memory with non-uniformthreshold voltage distribution", Solid-State Circuits Conference, 2001, Digest of Technical Papers, ISSCC, 2001 IEEE International, Feb. 5, 2001, pp. 28-29.

U.S. Appl. No. 12/463,759, Notice of Allowance dated Aug. 11, 2010.

Momodomi, M. et al., "A 4 Mb NAND EEPROM with tight programmed Vt Distribution", IEEE Journal of Solid-State Circuits, vol. 26, Issue 4, Apr. 1991, pp. 492-496.

Kim, et al. "A 120-mm2 64-Mb NAND Flash Memory Achieving 180 ns/Byte Effective Program Speed," IEEE Journal of Solid-State Circuits, vol. 32, No. 5, May 1997, pp. 670-680.

Imamiya, Kenichi et al., "A 125-mm2 1-Gb NAND Flash Memory with 10-MByte/s Program Speed", IEEE Journal of Solid-State Circuits, vol. 37, No. 11, Nov. 2002 1493 0018-9200/02 © 2002 IEEE, Nov. 2002. pp. 1493-1501.

Samsung Electronics Co., Ltd., "256 M×8 Bit/ 128m×16 Bit/ 512M×8 Bit NAND Flash Memory" K9K4G08U1M, K9F2G08U0m, K9F2G16U0m, Rev. 1.0, May 6, 2005, pp. 1-41.

Gal, et al., "Algorithms and data structures for flash memories", ACM Computing Surveys (CSUR), vol. 37, No. 2, Jun. 2005, Tel Aviv University, pp. p.138-163.

Lee et al., "A 90-nm CMOS 1.8V 2-Gb NAND Flash Memory for Mass Storage Applications", 1934 IEEE Journal of Solid-State Circuits, vol. 38, No. 11, 1493 0018-9200 copyright 2003, Nov. 2003, pp. 1934-1942.

Toshiba, "2GBIT (256M×8 Bits) CMOS NAND E2PROM", TH58NVG1S3AFT05, May 19, 2003, pp. 1-32.

* cited by examiner

US 8,102,708 B2

FLASH MULTI-LEVEL THRESHOLD DISTRIBUTION SCHEME

CROSS REFERENCE TO RELATED APPLICATIONS

This application is a Continuation of U.S. application Ser. No. 12/463,759, filed on May 11, 2009, now U.S. Pat. No. 7,821,827 issued on Oct. 26, 2010, which is a continuation of U.S. patent application Ser. No. 11/762,330, filed on Jun. 13, 2007, now U.S. Pat. No. 7,593,259 issued on Sep. 22, 2009, which claims the benefit of priority of U.S. Provisional Patent Application No. 60/844,154 filed on Sep. 13, 2006, the content of which is incorporated herein by reference in its entirety.

FIELD OF THE INVENTION

The present invention relates generally to Flash memory. More particularly, the present invention relates to a Flash memory device, a method for programming of Flash memory cell and a method for and a method for verifying a threshold voltage.

BACKGROUND OF THE INVENTION

Numerous types of consumer electronics products rely on some form of mass storage for retaining data or software for the execution of code by a microcontroller. Such consumer electronics are prolific, and include devices such as personal digital assistants (PDA's), portable music players, portable multimedia players (PMP's) and digital cameras. In PDA's, mass storage is required for storing applications and data, while portable music players and digital cameras require large amounts of mass storage for retaining music file data and/or image data. The mass storage solution for such portable electronics is preferably small in size, consumes minimal power, and has high storage density. This limits the selection to non-volatile forms of memory since volatile memories, such as static random access memory (SRAM) and dynamic random access memory (DRAM), require a constant application of power in order to retain data. As is known in the art, portable electronics rely on batteries that have a finite power supply. Therefore, non-volatile memories that retain data after power is removed are preferred.

While many consumer products use commodity Flash memory, Flash memory is indirectly used by consumers in products such as cell phones and devices with microprocessing functions. More specifically, the application specific integrated circuits (ASIC) commonly found in consumer electronics can have integrated Flash memory to enable firmware upgrades. Needless to say, Flash memory is versatile due to its optimal balance in size, storage density, and speed, making it a preferred non-volatile mass storage solution for consumer electronics.

FIG. 1 is a block diagram of a typical Flash memory device. Flash memory 10 includes logic circuitry for controlling various functions of the Flash circuits, registers for storing address and data, high voltage circuits for generating the required program and erase voltages, and core memory circuits for accessing the Flash memory array. The functions of the shown circuit blocks of Flash memory 10 should are well known in the art. Persons skilled in the art will understand that Flash memory 10 shown in FIG. 1 represents one possible Flash memory configuration among many possible configurations.

A read operation is a relatively straightforward access of data stored at a particular memory location of the memory array, called an address. Prior to a write operation to a specific block of the memory array, the specific block must first be erased with the application of high voltages. A write operation, more accurately called a program operation, requires the careful application of high voltages to a selected memory location, followed by a program verify operation to ensure that the data has been properly programmed. Furthermore, since high voltages are used, the Flash chip must be designed to be relatively tolerant to inadvertent programming of non-selected memory cells.

FIG. 2 is a circuit schematic showing a NAND cell string used in memory cell array shown in FIG. 1. FIG. 2 is a circuit schematic of two NAND memory cell strings. Each NAND memory cell string includes 32 serially connected floating gate memory cells 50 each connected to respective wordlines WL0 to WL31, a string select transistor 52 connected between the bitline 54 and the first floating gate memory cell 50, and a ground select transistor 56 connected between a common source line (CSL) 58 and the last floating gate memory cell 50. The gate of string select transistor 52 receives a string select signal SSL, while the gate of ground select transistor 56 receives a ground select signal GSL. The NAND memory cell strings of a block share common wordlines, string select SSL, and ground select GSL signal lines. The construction and arrangement of the shown NAND memory string is well known in the art.

As previously mentioned, the NAND memory cell strings of the memory array are first erased, according to well-known techniques in the art. Each block of NAND memory cell strings can be selectively erased; therefore one or more blocks can be simultaneously erased. When successfully erased, all erased floating gate memory cells 50 will have a negative threshold voltage. In effect, all erased memory cells 50 are set to a default logic state, such as a logic "1", for example. Programmed memory cells 50 will have their threshold voltages changed to a positive threshold voltage, thus representing the opposite "0" logic state.

FIG. 3 is a cross-sectional schematic of a typical Flash memory cell. A structure of such cells in well known in the art. Generally, control gate 60 is connected to a word line, while the floating gate 62 is isolated from all other nodes by an oxide insulator 61. Electrons (charge carriers) are injected into or ejected from floating gate 62 and substrate 68 having a source 64 and a drain 66, through thin tunneling oxide 63 between floating gate 62 and substrate 68.

FIG. 4 is a cross-sectional schematic of a nitride ROM cell having charge traps. Such a cell is also known in the art. In a nitride ROM cell, the floating gate is eliminated and the data is placed in a "holding chamber" or "charge traps" of the non-conductive layer 72, for example, of silicon nitride, between the control gate 70 and substrate 78 having a source 74 and a drain 76. Recently, silicon nanocrystals have also been used as charge traps.

Generally, a cell is programmed by applying a high voltage to its gate while keeping its source and drain terminals grounded. The high electrical field causes electrons in the memory cell channel to cross the gate oxide and embed in the floating gate (known as Fowler-Nordheim (F-N) Tunneling), thereby increasing the effective threshold voltage of the memory cell.

Due to the ever-increasing need for size reduction as well as the desire to increase the density of data storage, multi-level FLASH cells are now being widely used. As the name suggests, multi-level cells have more than two logic states per cell. A single cell storing two bits of information has 4 logic states corresponding to different levels of charge levels stored in the floating gates (or charge traps). Generally, a multi-level cell capable of storing N binary bits of data will have $2^N$ states or logic levels.

However, each floating gate transistor has a certain total range of threshold voltages in which it may practically be operated. The total range is divided into the number of states defined for the memory cell including allowances for clear distinction of one state from another. Variations in fabrication processes and ageing of the device may cause shifts in the threshold voltages. These shifts can weaken the strength of cell states by moving one state closer to the next state. Also, as more levels are squeezed into a fixed total range (for example, fixed supply-voltage range), the tolerance for these shifts decreases.

FIG. 5 is a threshold voltage (Vt) distribution graph for a multi-level Flash memory cell. The intermediate reference voltages are also shown. This particular graph illustrates the thresholds of a Flash memory cell capable of storing 2 bits of data. Therefore, each multi-level Flash memory cell must store one of four threshold voltages. In this prior art scheme, an erased state represented by a negative threshold voltage lies in an erase voltage domain. All erased memory cells will by default have this negative threshold voltage. The remaining three states must be programmed, and their corresponding threshold voltages will be positive in value and lie in the program voltage domain. In this example, the erase voltage domain is below zero while the program voltage domain is above zero volts. A problem with this scheme is the required tightness of the distribution for each state and the distance between the states.

Programming is typically done by the page, meaning that all the memory cells 50 in the block connected to the same wordline are selected to be programmed with write data (logic "0") at the same time. The remaining memory cells are thus unselected during programming. Since the memory cells start in the erased state (logic "1") prior to programming, only the memory cells to be programmed with the logic "0" should be subjected to the high electric fields necessary to promote F-N tunneling. However, due to the physical connections of the memory array, all the memory cells along the same wordline receive the same high voltage programming level. As a result, there is a potential that erased memory cells will have their threshold voltages unintentionally shifted. This is called program disturb, which is well known in the Flash memory field. This problem is more pronounced in multi-level cells as more levels are squeezed into a fixed voltage range.

Several parameters such as, Vt window, Vt distance, and Vread distance, are key parameters to determine read/write speed, reliability and lifetime of multi-level flash memory shown in FIG. 5. These three parameters influence one another: the cell Vt window and the cell Vt distance in a multi-level flash memory are much tighter than those in single-level flash memory since, in the case of a 2 bit cell, three cell states are in the program voltage domain with a positive Vt. If the cell Vt window is wider, the cell Vt distance is narrower. This reduces read sensing margin and eventually leads to a failure to sense neighboring cell states. In other words, Vt overlap or even minimum Vt distance between neighboring cell states leads to device failure.

The strength or safety margin of a Vt-state is greatest when the Vt is half-way between adjacent reference voltages. Upper and lower limits for each Vt-state defining a cell Vt window may be specified. For example, in FIG. 5, cell state 0 is between lower limit VL0 (−3 volts) and upper limit VU0 (−2 volts). Cell state 1 is between lower limit VL1 (0.3 volts) and upper limit VU1 (0.8 volts). Typically, the cell Vt window in multi-level flash memory is in between 0.5 to 1.0 volts. Ideally, a narrow cell Vt window is preferred for better definition and distinction of a state.

The cell Vt distance, which is defined as the difference in Vt between the lower limit of Vt of the threshold voltage range of one cell state and the upper limit of Vt of the threshold voltage range of the previous cell state. For example, the Vt distance between cell state 2 and cell state 1 is 1.5−0.8=0.7 volts. Typically the cell Vt distance in a multi-level flash memory cell is in between 0.7 to 1.0V. As is evident, larger cell Vt distances are preferred.

It is also desirable to have the Vread distance, the distance between the read pass voltage and the upper limit of the fully programmed state as high as possible. For example, in FIG. 5, Vread distance is 5.5−3.3=1.2 volts. However, for optimum performance of the memory cell, a lower Vread is preferred as high Vread can cause disturbance. Therefore, there is a trade-off between Vread distance and the value of Vread. Moreover, the fixed supply-voltage range available may determine the maximum Vread value.

Furthermore, as the number of rewrite (erase & program) cycle increases, the cell Vt window becomes wider by tunnel oxide degradation due to trapped charges. Also, the read pass voltage Vread should be lower to minimize read disturbance to unselected cells in the selected string. However, in order to accommodate the three cell states (in 2 bit cell) in the program voltage domain, the Vread distance has to be maintained at least well above VU3. This increases the level of Vread.

In order to tightly control the Vt of the programmed cell, incremental step pulse programming (ISPP) has been proposed and widely used in flash memories. FIG. 6 is a graph illustrating the relationship between the number of program pulses applied to a wordline for programming a threshold voltage versus the size of each pulse. Generally, tight threshold voltage distributions can be obtained when the step size of each program pulse is small. However, the trade-off is programming time since more program pulses would be required.

Accumulated program/erase cycles in multi-level flash memories with the above prior art scheme for cell Vt distribution typically results in well-known problems as described below.

Repeated charge transfer causes electrons to be trapped in the floating gate and the dielectric, which degrades program and erase characteristics of the cells. Consequently, cells require gradually higher program and erase voltages as the number of erase-program cycle increases; resulting in limiting the number of erase-program cycles on a cell.

The data retention characteristic in multi-level cells will be drastically degraded due to a small cell Vt distance. Moreover, as the Vt distribution for a given state is larger, the maximum Vt of programmed cells is higher. The higher Vt requires a higher programming voltage Vpgm, and adversely affects the data retention characteristics due to the larger electric field across the tunnel oxide. Moreover, the higher Vt required in multi-level cells require higher Vread. This causes read disturbance to unselected memory cells in the selected NAND cell string during read operations (i.e. soft-program by higher Vread to unselected memory cells).

In addition, the higher voltage requirements for read and write operations in multi-level flash memory does not scale with device dimension scaling as the electric field across all transistors including memory cells cannot be reduced.

Therefore, the life of a multi-level Flash memory cell is relatively short, typically only 10,000 cycles. This is significantly shorter than the 100,000 cycle limit for single bit per cell Flash memory devices.

SUMMARY OF THE INVENTION

It is an object of the present invention to obviate or mitigate at least one disadvantage of previous multi-level Flash memory cells devices. For example, present invention improves endurance of Flash memory cells by distributing programming threshold voltages in erase and program voltage domains.

In a first aspect, the present invention provides a Flash memory device. The Flash memory device includes a memory array having memory cells arranged in rows and columns and row control logic. The memory array has memory cells arranged in rows and columns, where each memory cell is erasable to have an erase threshold voltage in an erase voltage domain and programmable to have a program threshold voltage in the erase voltage domain. The row control logic selectively drive a wordline connected to a gate terminal of a memory cell with one of a positive voltage and a negative voltage during program verify and read operations. In an embodiment of the present aspect, the Flash memory device further includes a positive voltage generator and a negative voltage generator, where the positive voltage generator provides the positive voltage to the row control logic, and the negative voltage generator provides the negative voltage to the row control logic.

According to embodiments of the present aspect, each memory cell is programmable to have the program threshold voltage in a program voltage domain, and the erase voltage domain includes threshold voltages that are negative while the program voltage domain includes threshold voltages that are positive. In the present embodiment, each memory cell is programmable to store two bits of data corresponding to first, second, third and fourth threshold voltages, where the first threshold voltage and the second threshold voltage are in the erase voltage domain, and the third threshold voltage and the fourth threshold voltage are in the program voltage domain. The first threshold voltage can correspond to the erase threshold voltage.

In a second aspect, the present invention provides a method for verifying a threshold voltage of erased memory cells configured in a NAND string. The method includes precharging a bitline coupled to the NAND string to a first voltage level; applying a reference voltage to all wordlines connected to the erased memory cells of the NAND string for coupling the bitline to a second voltage level; and, sensing a voltage level change in the bitline.

According to an embodiment of the present invention the first voltage level is a positive voltage, and the erased memory cells have an erased threshold voltage in an erase voltage domain while the reference voltage is in the erase voltage domain. The reference voltage can be greater than the erased threshold voltage and less than a programmed threshold voltage in the erase voltage domain. In a further aspect of the present embodiment, the memory cells are erased if no voltage level change is sensed in the bitline, and the steps of precharging, applying a reference voltage and sensing the memory cells are erased.

In a third aspect, the present invention provides a method for programming a Flash memory cell initially erased to have a first threshold voltage in an erase voltage domain. The method includes changing the first threshold voltage of the Flash memory cell to a second threshold voltage, the second threshold voltage being in the erase voltage domain. The step of changing can include biasing a bitline connected to the Flash memory cell to programming voltage level followed by driving a wordline connected to the Flash memory cell with a predetermined number of pulses, each pulse having a predetermined step size.

According to an embodiment of the present aspect, the second threshold voltage is verified and the step of changing is repeated if the Flash memory cell does not have the second threshold voltage. The method of verifying includes precharging a bitline connected to the Flash memory cell to a first voltage level, driving a wordline connected to the Flash memory cell with a reference voltage in the erase voltage domain, and sensing a voltage level change in the bitline. The reference voltage can be greater than the first threshold voltage and less than the second threshold voltage. In a further embodiment, the Flash memory cell and a plurality of Flash memory cells form a NAND string, and the step of driving further includes driving wordlines connected to the plurality of Flash memory cells with a pass voltage.

In a fourth aspect, the present invention provides a method for reading a Flash memory cell programmable to have an erase voltage domain threshold voltage or a programming domain threshold voltage. The method includes determining one of an erase threshold voltage and the erase voltage domain threshold voltage by applying an erase voltage domain reference voltage to a gate terminal of the Flash memory cell and sensing a bitline voltage connected to the Flash memory cell; storing a logical state of the Flash memory cell; determining one of the erase voltage domain threshold voltage and the programming domain threshold voltage by applying another reference voltage to the gate terminal and sensing the bitline voltage connected to the Flash memory cell; and, updating the logical state.

In a fifth aspect, the present invention provides a Flash memory device. The Flash memory device includes a memory array having memory cells, each memory cell erasable to have a threshold voltage in an erase voltage domain, and programmable to have at least one threshold voltage level in the erase voltage domain and at least another threshold voltage in a program voltage domain.

According to embodiments of the present aspect, the erase voltage domain includes threshold voltages that are negative and the program voltage domain includes threshold voltages that are positive, and each memory cell is programmable to store a plurality of bits of data corresponding to first, second, third and fourth threshold voltages. The first threshold voltage and the second threshold voltage can be in the erase voltage domain, and the third threshold voltage and the fourth threshold voltage can be in the program voltage domain. In an alternate embodiment, the erase voltage domain includes threshold voltages that are positive and the program voltage domain includes threshold voltages that are negative.

In another embodiment of the present aspect, the Flash memory device further includes row control logic for selectively driving a wordline with a negative voltage and positive voltage in response to a row address. The Flash memory device can further include a first voltage generator for providing the positive voltage and a second voltage generator for providing the negative voltage. The row control logic includes a row decoder for receiving the positive voltage and the negative voltage, the row decoder providing row signals in response to the row address, and a wordline driver for passing the row signals in response to an enable signal. In yet another embodiment, the row control logic includes a block decoder for providing the enable signal in response to a block address, the enable signal having one of the positive voltage and the negative voltage.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, aspects of the present invention provide a threshold voltage distribution scheme for multi-level Flash cells with optimal Vt window and maximum Vt distance, while at the same time maintaining Vread at lower levels. In one embodiment, this is accomplished by programming at least one cell state in the erase voltage domain (for example, with a negative Vt value).

Figure 7:
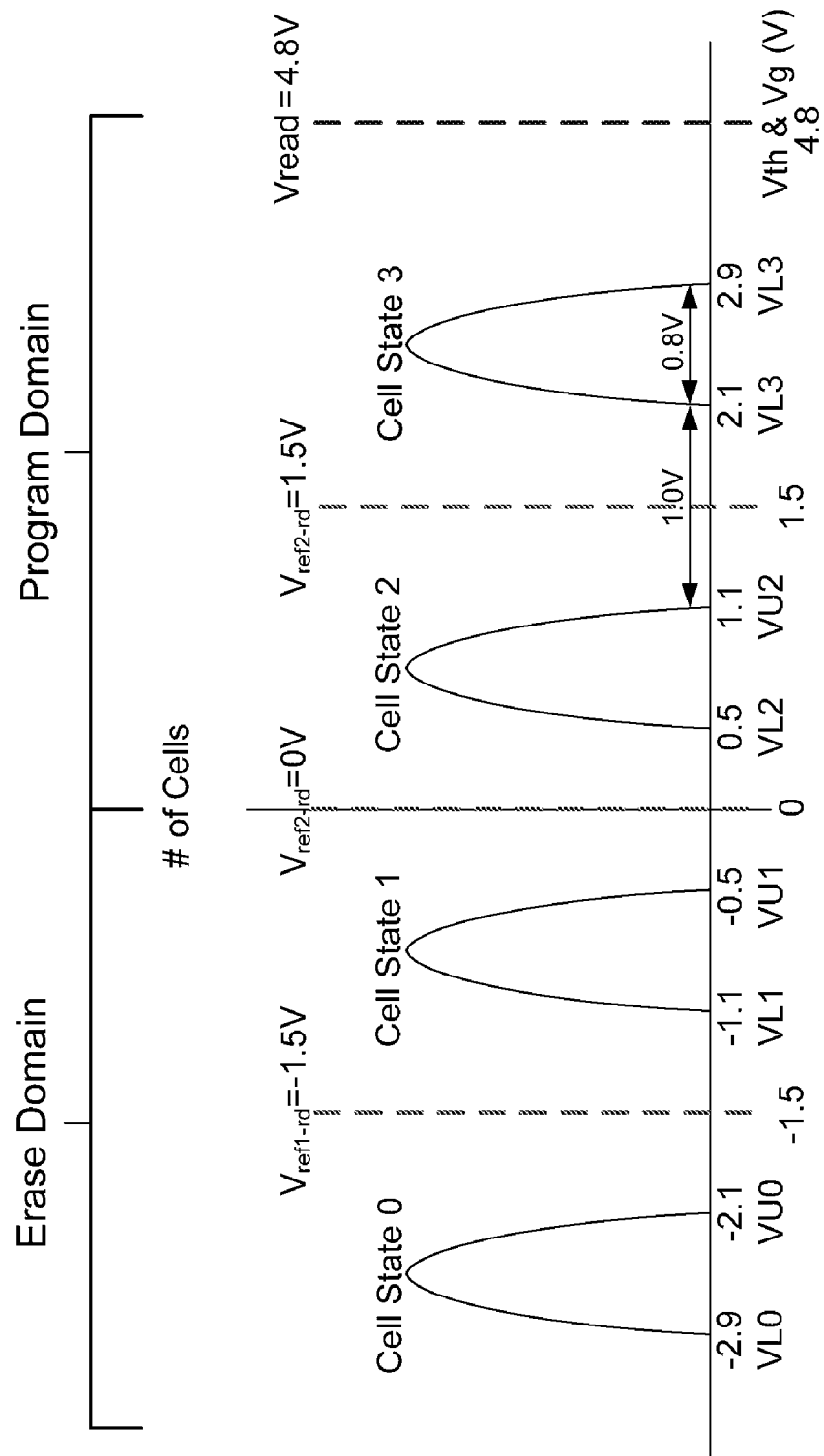
FIG. 7 is an exemplary embodiment of the invention showing a threshold voltage distribution for a Flash memory cell capable of storing 2 bits of data.

FIG. 7 is an exemplary embodiment of the invention. FIG. 7 shows a threshold voltage distribution for a multi-level Flash memory cell capable of storing 2 bits of data. In the present embodiment, there is one program state (cell state 1, corresponding to data "10") lying in the erased voltage domain with erased state (cell state 0, corresponding to data "11"). Therefore, there are two cell states lying in the erased voltage domain and two cell states (cell state 2, corresponding to data "01" and cell state 3, corresponding to data "00") in the program voltage domain. By programming this state in the erased voltage domain, different advantages are obtained. First, endurance is immediately increased relative to the prior art devices having the same Vt window, since the Vt distance between states is increased. Second, endurance is further increased by minimizing the Vt window, at the expense of programming speed. Third, the Vt distance and Vt window requirements are relaxed to provide improved programming performance over prior art devices, but having the same endurance. In addition, the Vread voltage for unselected cells can be lowered, for example, from a typical value of 5.5 volts to 4.8 volts. FIG. 7 shows example VL and VU values, but any VL and VU can be set for each state.

In conventional approaches, such as the threshold voltage scheme described with reference to FIG. 5, the cell state 0 has a negative Vt (erase voltage domain) while the remaining three cell states (states 1, 2, and 3) have positive Vt's (program voltage domain). In the threshold voltage scheme of the present embodiment as illustrated in FIG. 7, cell states 0 and 1 have negative Vt's, while cell states 2 and 3 have positive Vt's. The number of cell states in the erase voltage domain and the program voltage domain are equal and hence this scheme is referred to as a "balanced" Vt distribution scheme.

This balanced cell Vt distribution scheme provides at least the following advantages: Due to the separation of the cell states, the Vt window of each state can be widened, thus improving the program speed. The cell Vt distance is maximized, which will greatly improve data retention and endurance. This scheme further lowers the program voltage Vpgm and program-pass voltage Vpass, allowing for scaling with device geometry scaling. It also enables lowering of the Vread voltage, which, as a result, provides higher immunity to read disturbance typically encountered by conventional high Vread values. While FIG. 7 is an example Vt distribution for a two bit per cell device, cells storing any number of bits will benefit from the embodiments of the present invention.

Figure 8:
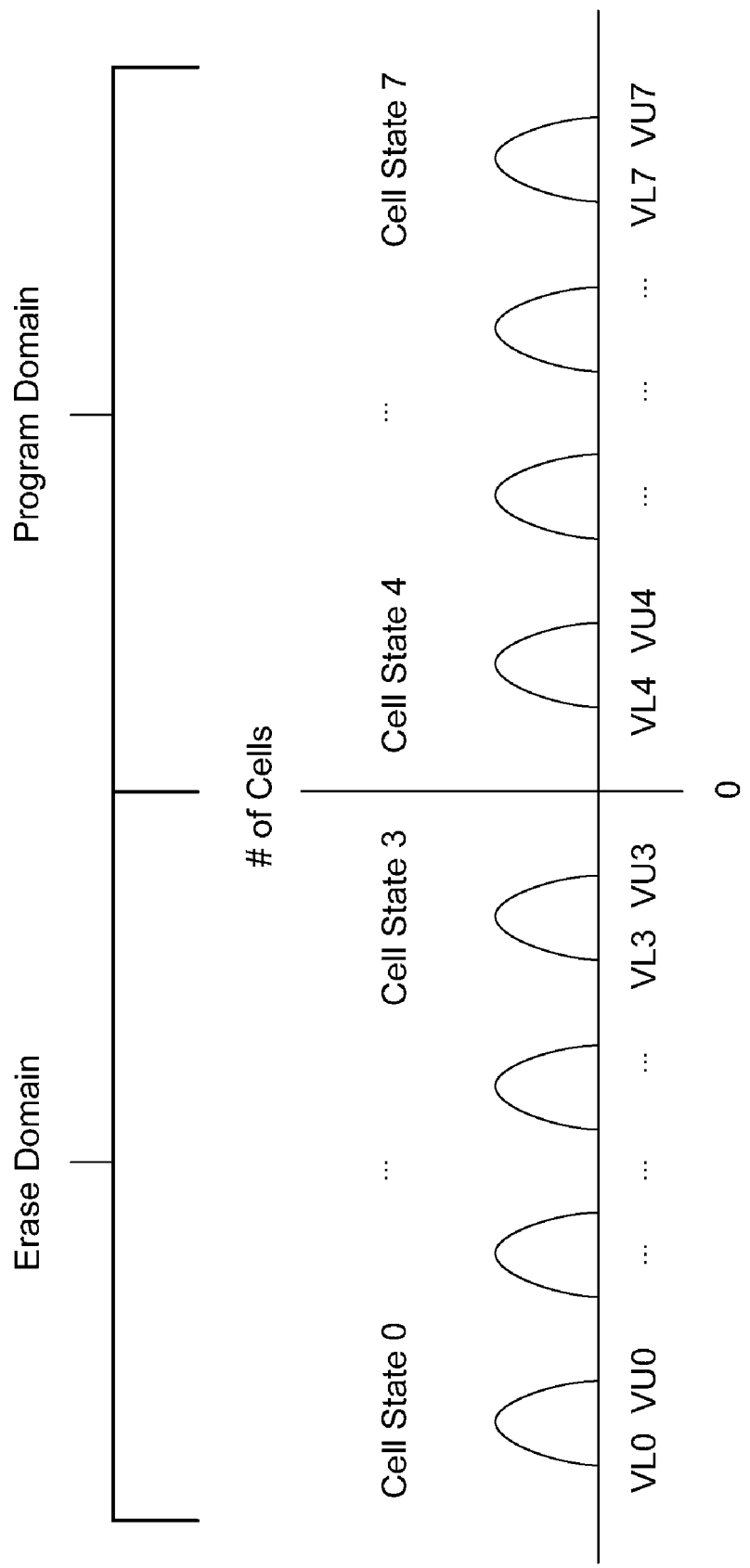
FIG. 8 is an alternate embodiment of the invention showing a threshold voltage distribution graph for a Flash memory cell capable of storing 3 bits of data.

FIG. 8 is an alternate embodiment of the invention. FIG. 8 shows a threshold voltage distribution graph for a multi-level Flash memory cell capable of storing 3 bits of information (i.e. eight different states). It should be noted that in the embodiment of FIG. 8, exactly half of the eight possible states lie in the erase voltage domain while the other half lies in the program voltage domain. In further alternate embodiments, there can be five states in the erase voltage domain or three states in the erase voltage domain, or other combinations having at least two states in the erase voltage domain.

Figure 6:
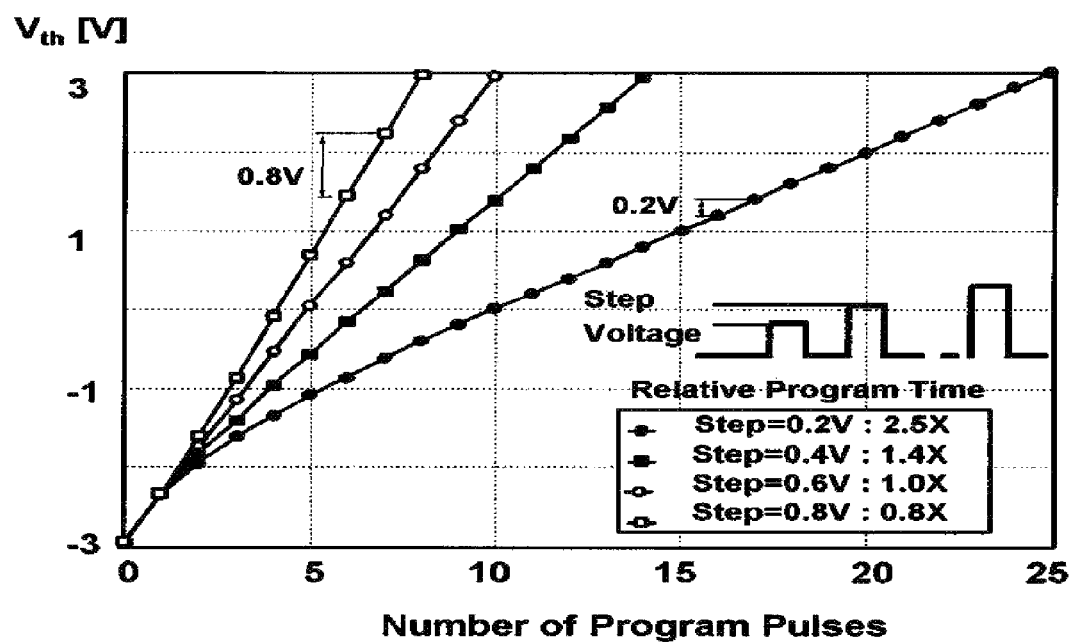
FIG. 6 is a graph illustrating the relationship between the number of program pulses applied to a wordline for programming a threshold voltage versus the size of each pulse.

As previously discussed for FIG. 6, ISPP is used for programming desired threshold voltages corresponding to the different states of the multi-level Flash memory cells. As all memory cells are programmed to a desired threshold voltage from the erased state, ISPP gradually shifts the negative threshold voltage of an erased Flash memory cell using increasingly larger voltage pulses applied to its control gate. The incremental step size and number of pulses determines the final threshold voltage of the programmed Flash memory cell. According to an embodiment of the present invention, a programmed state in the erase voltage domain is achieved by setting the number of pulses and step size of the pulses such that the desired negative threshold voltage is obtained. In the example of FIG. 6, a −2V threshold voltage is obtained by using between 2 and 3 pulses, depending on the selected pulse step size. Once the erase domain program states have been programmed, the remaining program domain states are programmed according to known techniques. It is noted that the step size for programming the erase domain states can be small without impacting programming speed since the threshold voltage shift from the erase state is relatively small.

A part of any programming operation is the program verify operation, which is used to check that the data has been properly programmed. For example, the desired threshold voltage may not have been set during a program operation. Therefore, the memory cell(s) is subjected to reprogramming until the program verify clears the memory cell, or until it is determined that the cell is defective. Once the program verify operation clears the memory cells, the data can be read. According to an embodiment of the present invention, program verify and read operations are executed with both positive and negative voltages.

Figure 5:
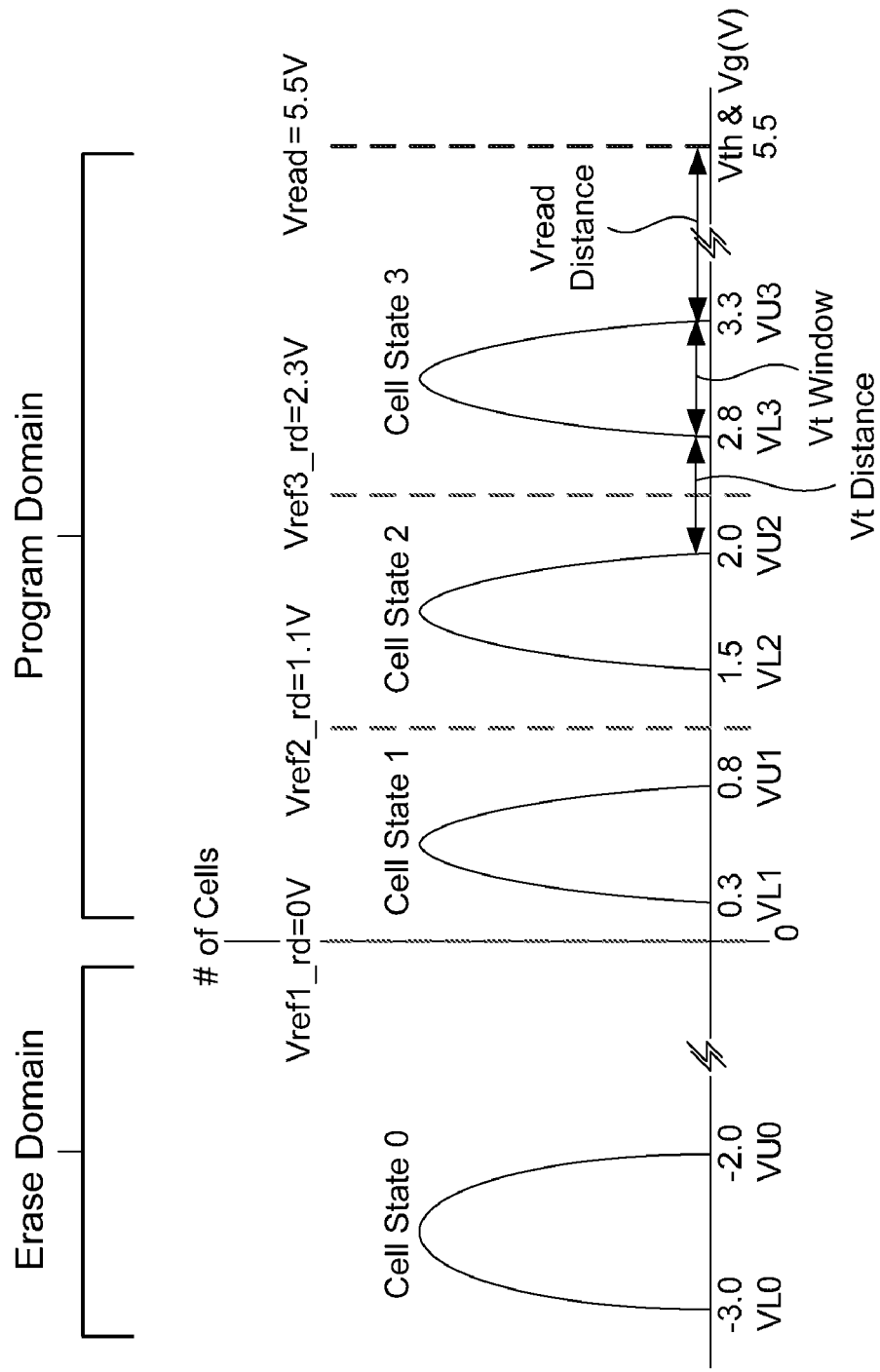
FIG. 5 is a threshold voltage (Vt) distribution graph for a multi-level Flash memory cell of the prior art.

Table 1 shows bias conditions of the selected wordline and unselected wordlines to distinguish each cell state during read, verify & control programmed cell Vt during program in a conventional multi-level flash memory using the cell Vt distribution scheme of FIG. 5. Table 2 shows bias conditions of the selected wordline and unselected wordlines during program verify and read in a multi-level flash memory programmable to have at least two states in the erase voltage domain, according to an aspect of the present invention.

TABLE 1

|  | Program Verify | | Read | |
|---|---|---|---|---|
|  | Selected Wordline | Unselected Wordlines | Selected Wordline | Unselected Wordlines |
| Cell State 0 ⇔ 1 | 0.3 V (Vref_pv1) | 5.5 V (Vread) | 0 V (Vref_rd1) | 5.5 V (Vread) |
| Cell State 1 ⇔ 2 | 1.5 V (Vref_pv2) | 5.5 V (Vread) | 1.1 V (Vref_rd2) | 5.5 V (Vread) |
| Cell State 2 ⇔ 3 | 2.8 V (Vref_pv3) | 5.5 V (Vread) | 2.3 V (Vref_rd3) | 5.5 V (Vread) |

Table 2 shows exemplary bias conditions for the program verify and read operations used for a multi-level Flash cell programmable to have at least two states in the erase voltage domain. As illustrated in Table 2, the negative voltages are applied to the selected wordline during the read and program verify operations for cells having negative cell Vt (i.e. cell state 0 and cell state 1). It should be noted that the voltage values in Table 2 are for illustration purpose only. In other words, voltage values in Table 2 can be varied according to process technology and cell characteristics.

TABLE 2

|  | Program Verify | | Read | |
|---|---|---|---|---|
|  | Selected Wordline | Unselected Wordlines | Selected Wordline | Unselected Wordlines |
| Cell State 0 ⇔ 1 | −1.1 V (Vref_pv1) | 4.8 V (Vread) | −1.5 V (Vref_rd1) | 4.8 V (Vread) |
| Cell State 1 ⇔ 2 | 0.5 V (Vref_pv2) | 4.8 V (Vread) | 0 V (Vref_rd2) | 4.8 V (Vread) |
| Cell State 2 ⇔ 3 | 2.1 V (Vref_pv3) | 4.8 V (Vread) | 1.5 V (Vref_rd3) | 4.8 V (Vread) |

Due to shift in the Vt of at least one programmed cell state to the erase voltage domain, the program verify voltage and read voltage applied to the selected wordlines are different from conventional program verify and read operations, as shown in Table 2. Typically, all program verify voltage and read voltage are implemented with positive voltage values. However, the threshold voltage distribution scheme for multi-level Flash cells described herein utilizes both positive and negative voltages for program verify and read operations. This results in changes to the implementation for the wordline circuits as described below.

Figure 9:
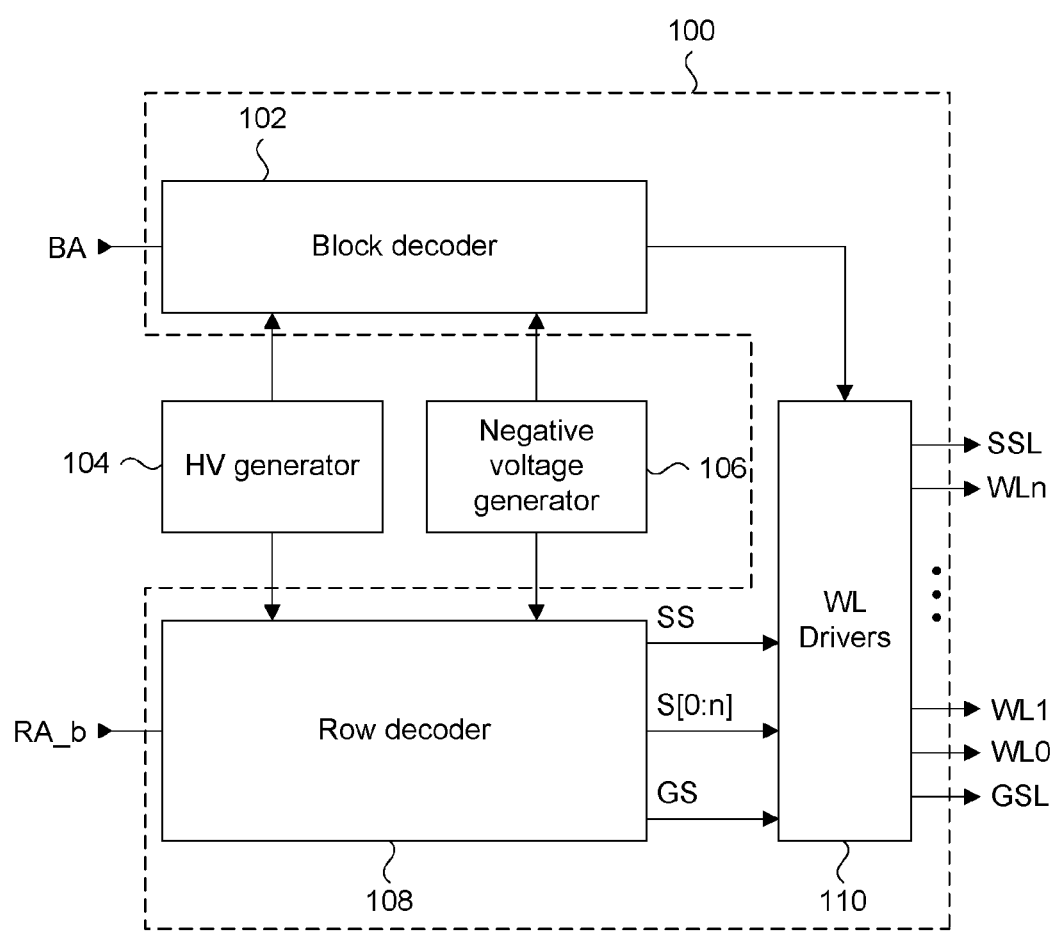
FIG. 9 is a block diagram of the row circuits for a multi-level Flash memory device, according to an embodiment of the present invention.

FIG. 9 is a block diagram of an exemplary row control logic for a multi-level Flash memory device according to an embodiment of the present invention. The row control logic 100 includes a block decoder 102, a row decoder circuit 108 and a wordline driver circuit 110. The device having row control logic 100 has a high voltage generator 104 and a negative voltage generator 106, which may be used by other circuits that are not shown in FIG. 9. There is one block decoder 102 per memory block, which receives a block address BA, for enabling the wordline drivers. The row decoder 108 is commonly shared among all memory blocks, which receives a row address RA_b, as well as other signals which are not shown, for generating the source select signal SS, wordline signals S[0:n], and the ground select signal GS, generically referred to as row signals. Since at least one of the programmed states will be in the erase voltage domain (with a negative threshold voltage for example), the block decoder 102 and the row decoder circuit 108 will receive one or more negative voltages for application to a selected wordline signal. In response to a valid block address BA and row decoder signals, signals SSL, GSL and WL0-WLn are set to their required voltage levels during program, program verify and read operations. Example voltages are shown in Table 2 for program verify and read operations.

Figure 10:
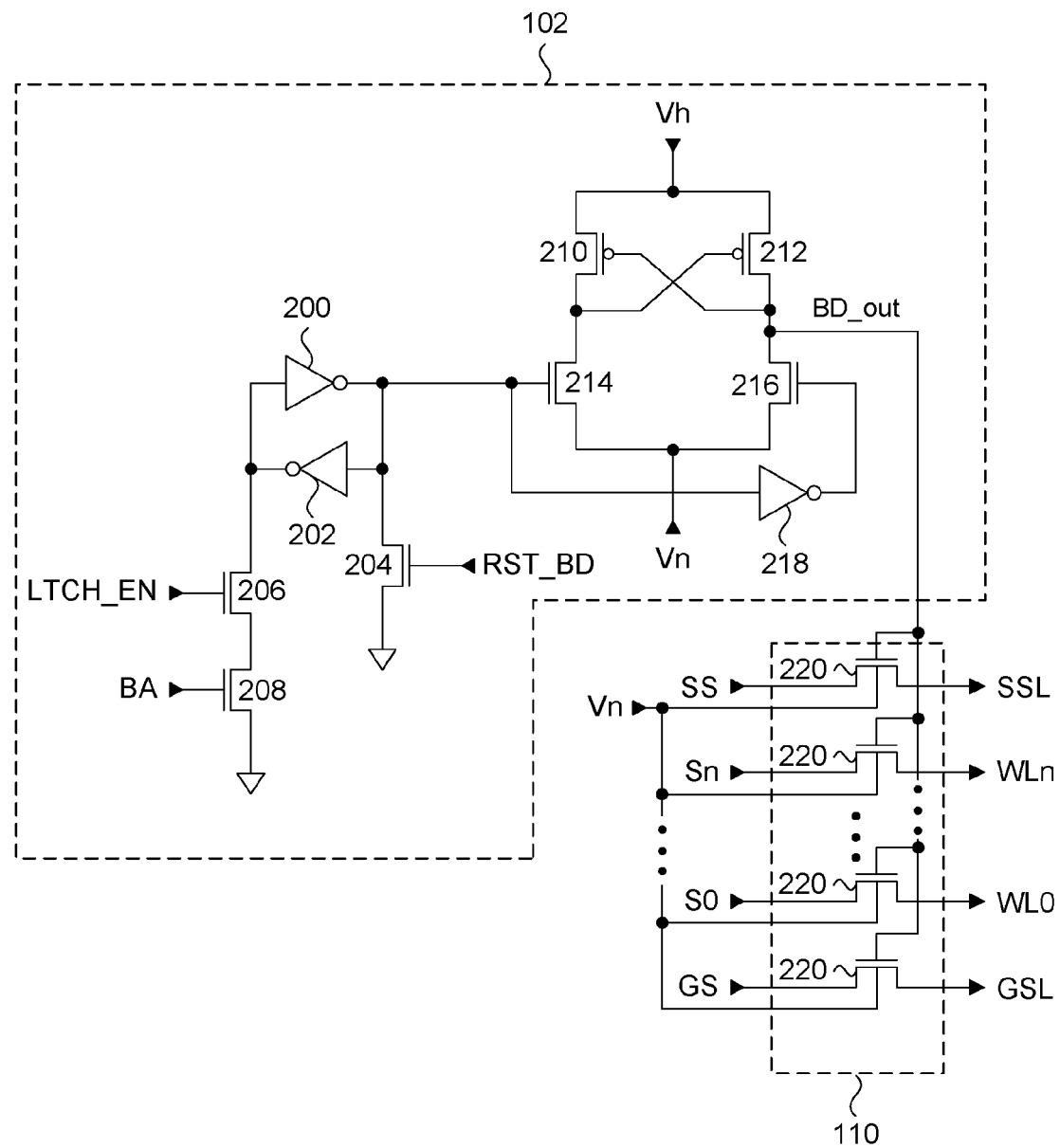
FIG. 10 is a circuit schematic of the block decoder and the wordline driver circuit shown in FIG. 9.

FIG. 10 is a circuit schematic showing circuit details of the block decoder 102 and wordline driver circuit 110 of FIG. 9. Block decoder 102 is associated with one memory block, and includes a cross coupled inverter latch circuit and level shifter circuit. The latch circuit includes cross-coupled inverters 200 and 202, an n-channel reset transistor 204, and n-channel enable transistors 206 and 208. The latch circuit is enabled, or set, when latch enable signal LTCH_EN and a block address BA are at the high logic level. The latch circuit of inverters 200 and 202 is reset when signal RST_BD is at the high logic level. The level shifter circuit includes a pair of cross-coupled p-channel transistors 210 and 212, each being connected to respective n-channel steering transistors 214 and 216. The shared terminals of transistors 210 and 212 receives a high voltage Vh while the shared terminals of transistors 214 and 216 receives a negative voltage Vn. Node Vh is connected to the positive voltage generator 104 while node Vn is connected to the negative voltage generator 106. Steering transistors 214 and 216 have gate terminals connected to the output of inverter 200 and inverter 218, the input of which is connected to the gate of transistor 214. It is noted that the high voltage supply provided to inverter 200 is lower than Vh while the low voltage supply provided to inverter 202 is higher than Vn. The output of the level shifter circuit (an enabling signal) BD_out drives the gate terminals of all the n-channel pass transistors 220 of wordline drivers 110. The substrate terminal of all the pass transistors 220 are connected to Vn. Each pass transistor can selectively pass the source select (SS), wordline (S0-Sn)

and ground select (GS) signals to the memory array. Placeholder "n" can be any non-zero integer number, typically corresponding to the maximum number of cells in the Flash cell string. The general operation of the block decoder circuit is now described.

In a read operation for example, one memory block is selected while other blocks remain unselected. In otherwords, one memory block is enabled while remaining memory blocks are disabled. To enable a memory block, LTCH_EN and BA will be at the high logic level, thereby setting the level shifter circuit to output high voltage Vh. Therefore, all the pass transistors 220 of wordline driver circuit 110 are turned on. Unselected wordlines (unselected Si) will be set to a Vread voltage while the selected wordline (selected Si) will be set to the desired voltage. The desired voltage can be −1.5V if the present read operation is intended to distinguish between cell state 0 and cell state 1, for example. Disabled memory blocks will have their corresponding block decoder circuit output set to output low voltage Vn (−1.5V for example). Therefore, all the pass transistors 220 in the unselected memory blocks will be turned off even though one of the Si signals may be at Vn of −1.5V for example. Table 3 illustrates example Vh and Vn voltages for read, program, program verify, erase and erase verify operations.

TABLE 3

|  | Vh | Vn |
|---|---|---|
| Read | ~6.5 V | 0 V/−1.5 V (Vref_rd1) |
| Program | ~18 V | 0 V |
| Program Verify | ~6.5 V | 0 V/−1.1 V (Vref_pv1) |
| Erase | Vdd | 0 V |
| Erase Verify | ~6.5 V | 0 V |

Figure 11:
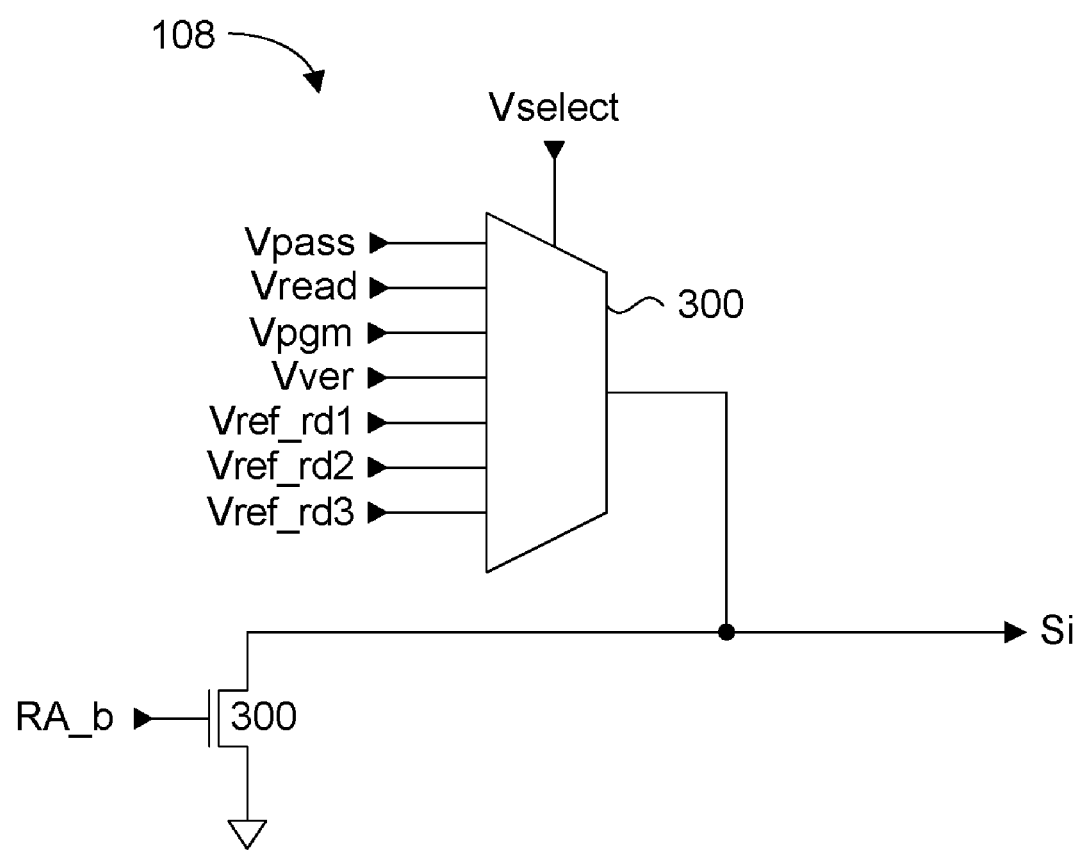
FIG. 11 is a circuit schematic of the row decoder circuit shown in FIG. 9.

FIG. 11 is a circuit schematic showing one row decoder circuit of row decoder 108 of FIG. 9. The presently shown schematic of FIG. 11 is a functional representation only, as there can be different specific circuit implementations that are possible. In prior art row decoder circuits, only voltages in the program voltage domain are provided. According to an embodiment of the present invention, both program voltage domain (ie. positive voltages) and erase voltage domain (ie. negative voltages) are provided by the presently shown row decoder circuit. FIG. 11 shows one circuit for generating one row signal Si where i can be an integer value between 0 and n, but the circuits for generating signals SS and GS are similarly configured. The row decoder circuit includes a multiplexor 300 for receiving all the voltages that are used during program, program verify, read, erase and erase verify operations. This includes for example, a program verify voltage Vver, a read voltage Vread, a pass voltage Vpass, and a programming voltage Vpgm.

Multiplexor 300 further receives the different reference voltages used for read and program verify operations, such as Vref_rd1, Vref_rd2 and Vref_rd3 for the 2 bit/cell configuration. In the present embodiment, Vref_rd1 is a negative erase domain voltage while Vref_rd2 and Vref_rd3 are positive program domain voltages. Any number of voltages can be provided to multiplexor 300, and then selectively passed to node Sn. Voltage selection signal Vselect is used to pass any one of the voltages. Those skilled in the art will understand that Vselect will be a multi-bit signal, the number depending on the number of input ports that multiplexor 300 is configured to have. The row decoder circuit includes an n-channel disabling transistor 302 connected between node Sn and ground for disabling the circuit when not in use, or during a power down mode of operation, for example.

In general operation, signal Sn is enabled in response to a selected address for enabling a particular wordline when address RA_b is at the low logic level. RA_b can be a decoded row address or a predecoded row address. Depending on the operation being performed, Vselect will be set to pass one of the voltages received by multiplexor 300 to the Sn node. While not shown, the voltage generators 104 and 106 of FIG. 9 are controlled to provide the appropriate voltage levels depending on the operation being performed. Table 4 illustrates example voltages applied to the wordlines and by the row decoder circuit during a read operation for selected and unselected wordlines Si, where i is an integer value between 0 and n. Table 5 illustrates example voltages applied to the wordlines and by the row decoder circuit during a program verify operation for selected and unselected wordlines Si, where i is an integer value between 0 and n.

TABLE 4

| Signal | Cell State 1 ⇔ 2 | Cell State 2 ⇔ 3 | Cell State 3 ⇔ 4 |
|---|---|---|---|
| Unselected BD_out (Unselected Block) | −1.5 V | −1.5 V or 0 V | −1.5 V or 0 V |
| Selected BD_out (Selected Block) | 6.5 V | 6.5 V | 6.5 V |
| Vh | 6.5 V | 6.5 V | 6.5 V |
| Vn | −1.5 V | −1.5 V or 0 V | −1.5 V or 0 V |
| SS | 4.8 V (Vread) | 4.8 V (Vread) | 4.8 V (Vread) |
| Selected Si | −1.5 V (Vref_rd1) | 0 V (Vref_rd2) | 1.5 V (Vref_rd3) |
| Unselected Si | 4.8 V (Vread) | 4.8 V (Vread) | 4.8 V (Vread) |
| GS | 4.8 V (Vread) | 4.8 V (Vread) | 4.8 V (Vread) |

TABLE 5

| Signal | Cell State 1 ⇔ 2 | Cell State 2 ⇔ 3 | Cell State 3 ⇔ 4 |
|---|---|---|---|
| Unselected BD_out (Unselected Block) | −1.1 V | −1.1 V or 0 V | −1.1 V or 0 V |
| Selected BD_out (Selected Block) | 6.5 V | 6.5 V | 6.5 V |
| Vh | 6.5 V | 6.5 V | 6.5 V |
| Vn | −1.1 V | 0.5 V or 0 V | 2.1 V or 0 V |
| SS | 4.8 V (Vread) | 4.8 V (Vread) | 4.8 V (Vread) |
| Selected Si | −1.1 V (Vref_pv1) | 0.5 V (Vref_pv2) | 2.1 V (Vref_pv3) |
| Unselected Si | 4.8 V (Vread) | 4.8 V (Vread) | 4.8 V (Vread) |
| GS | 4.8 V (Vread) | 4.8 V (Vread) | 4.8 V (Vread) |

Figure 12:
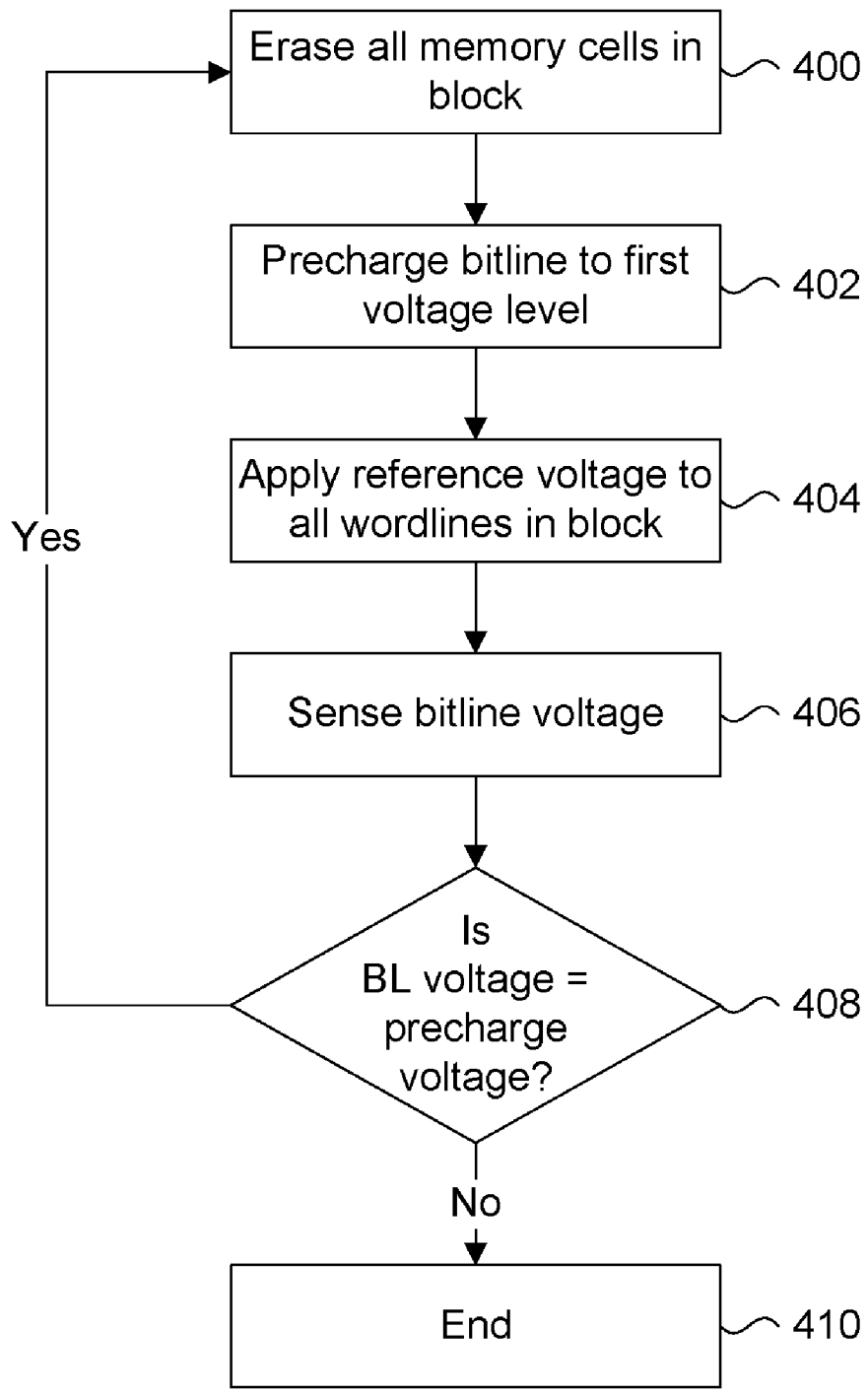
FIG. 12 is a flow chart showing a method for performing an erase-verify operation.

In the prior art programming schemes, programmed cell states are confined to the program voltage domain, ie. having positive threshold voltages. In the presently disclosed balanced threshold programming scheme, at least one programmed cell state resides in the erase voltage domain. Therefore, an erase verify algorithm is used for ensuring that all the erased memory cells have the proper erase threshold voltage level. FIG. 12 is a flow chart showing a method for performing an erase verify operation according to an embodiment of the present invention. Since a programmed state will be in the erase voltage domain, the method of FIG. 12 ensures that all the memory cells are sufficiently erased such that their threshold voltages do not lie within the designated negative threshold voltage range for a programmed state.

Figure 1:
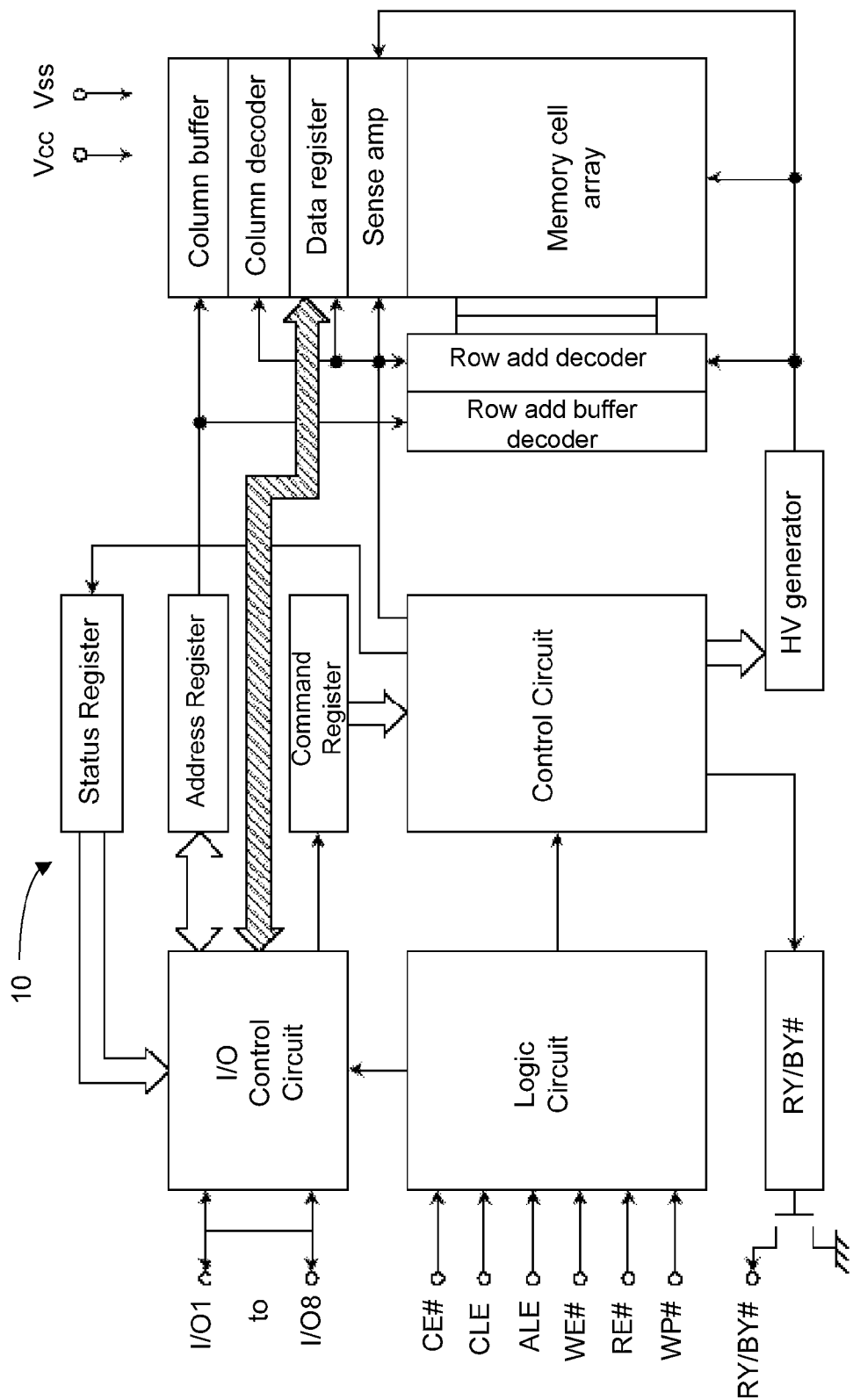
FIG. 1 is a block diagram of a typical Flash memory device.
Figure 2:
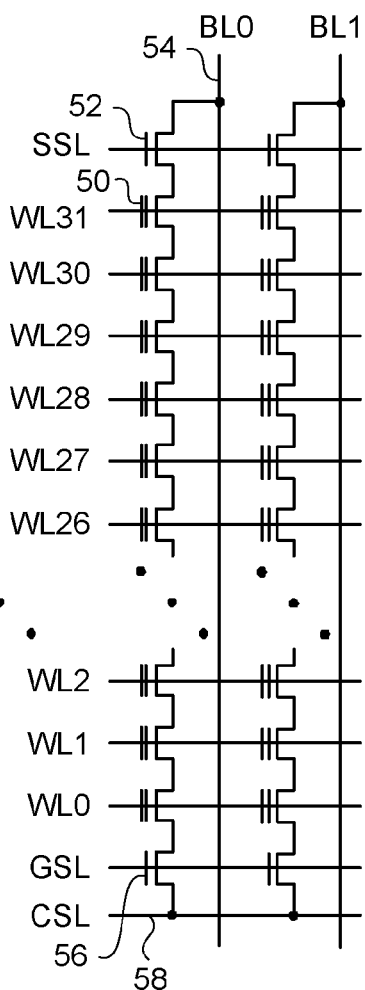
FIG. 2 is a circuit schematic of a NAND cell string.
Figure 3:
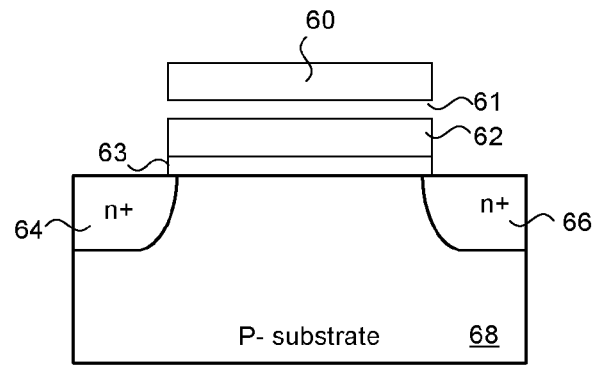
FIG. 3 is a cross-sectional schematic of a typical Flash memory cell.
Figure 4:
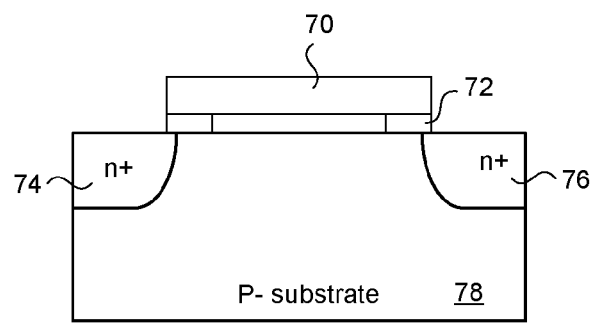
FIG. 4 is a cross-sectional schematic of a nitride ROM cell having charge traps.

The method of FIG. 12 commences at step 400 by erasing a selected block of the memory array. After all the memory cells have been erased, all the bitlines of the selected memory block are precharged to a first voltage level such as VDD at step 402. A reference voltage is then applied to all the wordlines of the memory cells at step 404. It is presumed that the memory cells are configured as NAND cell strings, such as the ones previously shown in FIG. 2. The reference voltage is selected to be greater than the highest possible erase threshold voltage for the erase state, and lower than the lowest possible program threshold voltage for the adjacent program state. Generally, the reference voltage in the erase domain voltage, and in the example where the erase domain is below 0V, the reference voltage is a negative voltage level. With reference to the example threshold voltage distribution of FIG. 7 for example, if all the memory cells have been properly erased, then their threshold voltage should be between −2.9 and −2.1 volts. The reference voltage applied to the wordlines will be about −1.5 volts. If all the memory cells have been properly erased, then the −1.5 volt level on wordlines 0 to 31 is sufficient to turn on the transistors and discharge the bitline to CSL or ground. However, if any one of the cells in the NAND cell string has a threshold voltage higher than −1.5 volts, then the bitline will not discharge to ground. Therefore, the bitline voltage is sensed at step 406. At step 408, a determination is made to see if the bitline voltage is equal or not to the original pre-charge voltage. If the bitline voltage is the same, then the method loops back to step 400 to re-erase the cells and repeat the verification process. Otherwise, all the memory cells have been properly erased and the erase verify method ends at step 410.

Figure 13:
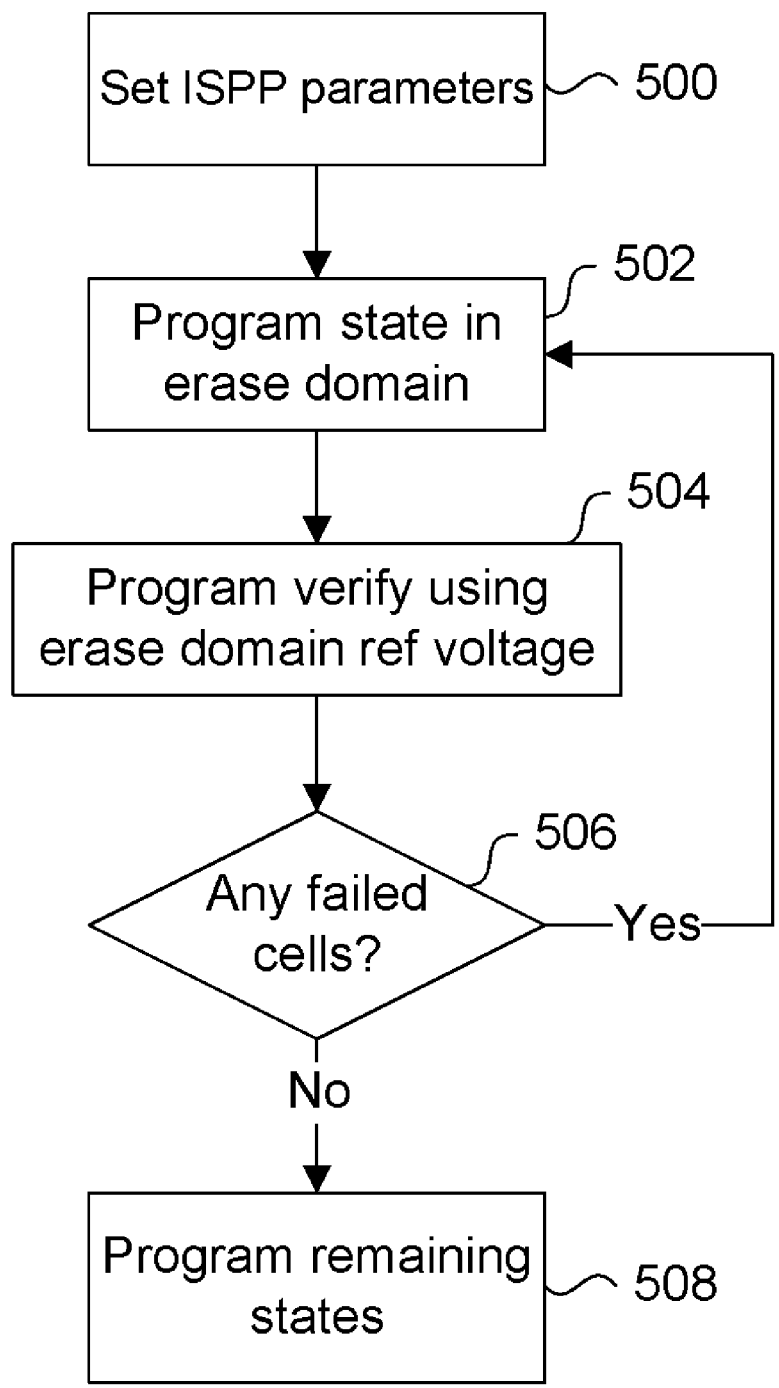
FIG. 13 is a flow chart showing a method for programming multiple threshold voltages, according to an embodiment of the present invention.

After all the memory cells have been verified as being successfully erased, programming of data to the memory cells can proceed. FIG. 13 is a flow chart illustrating a method of programming one programmed state in the erase voltage domain, according to an embodiment of the present invention. The method starts at step 500 by setting the ISPP parameters such as number of program pulses and step size for each pulse, for the state to be programmed in the erase voltage domain. At step 502 the erase voltage domain threshold voltage is programmed to the selected Flash memory cells. As previously mentioned, the erase threshold voltage of a memory cell is effectively shifted to the desired erase domain threshold voltage level by using a predetermined number of program pulses and step sizes in accordance with the ISPP scheme. At step 504 a program verify operation is executed to ensure that the programmed state has been properly programmed. More specifically, the program verify will use the appropriate erase voltage domain reference voltage to verify the programmed state. In the present example, the program verify reference voltage will be a negative voltage level. Further details of the program verify operation are shown later in FIG. 14.

A determination is made at step 506 to see if at least one memory cell fails program verification. If at least one failure is determined, then the method loops back to step 502 for reprogramming of the at least one memory cell. Otherwise, all the memory cells have been deemed to have been successfully programmed, and the method proceeds to step 508 where subsequent programming sequences are executed for the remaining states. The remaining states can include further erase voltage domain states and/or program voltage domain states. Further erase voltage domain states are programmed according to the same sequence shown in steps 500 to 506, but with different ISPP parameters and program verify reference voltages.

Figure 14:
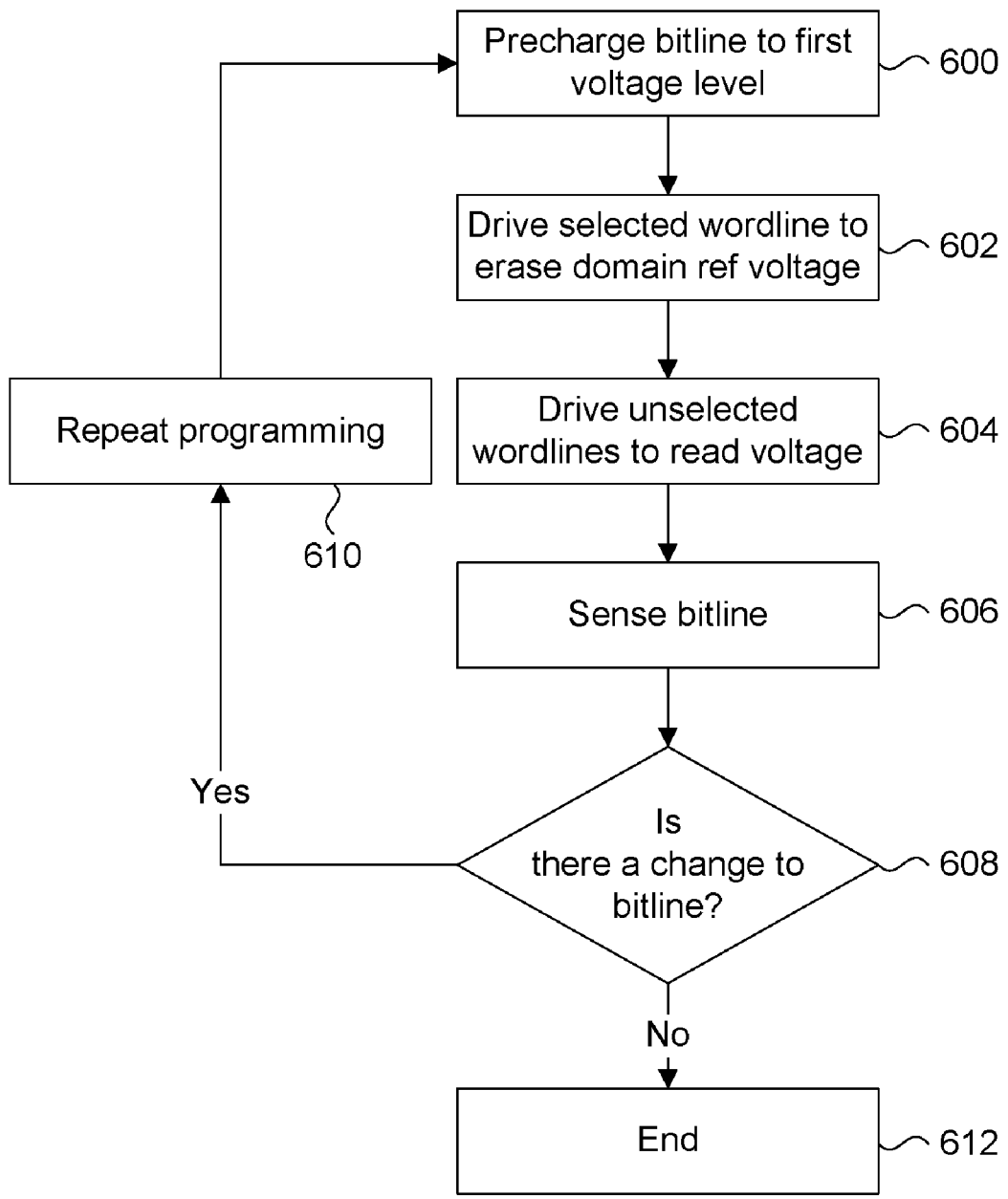
FIG. 14 is a flow chart showing a program verify method, according to an embodiment of the present invention; and, FIG. 15 is a flow chart showing a method for reading data, according to an embodiment of the present invention.

FIG. 14 is a flow chart of a method for performing a program verify operation after a state has been programmed in the erase voltage domain. The method starts at step 600 by precharging the bitlines to a first voltage level, such as positive voltage level for example. At step 602 the selected wordline corresponding to the page that was programmed is driven to an erase voltage domain reference voltage, and unselected wordlines are driven to a read voltage at step 604. The erase voltage domain reference voltage is selected to be lower than the desired threshold voltage range of the currently programmed state, but higher than the adjacent state having a lower threshold voltage range. In the example of FIG. 7, if the programmed state being verified is cell state 1, then the erase voltage domain reference voltage is selected to be higher than Vref1-rd. The read voltage is typically a program voltage domain voltage sufficient to turn on a memory cell having the highest programmed threshold voltage, such as Vread in the example of FIG. 7. The bitline is sensed at step 606, and a determination is made at step 608 to see if the bitline voltage has changed, ie. been discharged through the NAND cell string. If there is a change to the bitline voltage, then the threshold voltage of the currently programmed state is too low and conducts current. Thus the memory cell(s) are deemed to have failed, and the method proceeds to step 610 to repeat programming for the failed cell(s). Otherwise, the program verify method ends at step 612 as all the cells have passed verification for the currently programmed state.

Once data has been programmed and verified, it can be read from the memory array. In one multi-level sensing scheme, latches for the two bits representing one of four possible logic states are set to default states, such as 1,1 for example. Reading is accomplished by iteratively reading out the cell by applying Vref1-rd, Vref2-rd and Vref3-rd in each iteration. If the threshold voltage of the selected memory cell is determined to be less than the applied reference voltage for that iteration, then neither bit state is changed, or toggled. If the threshold voltage of the selected memory cell is determined to be greater than the applied reference voltage for that iteration, then one bit state is changed, or toggled. The particular bit to toggle depends on the specific read iteration being executed. This ensures that the bit states for the lowest threshold voltage (ie. erased state) will remain unchanged for each subsequent iteration. Hence, for a two bit multi-level memory cell, three read iterations are required for determining the two bit state of the memory cell.

Figure 15:
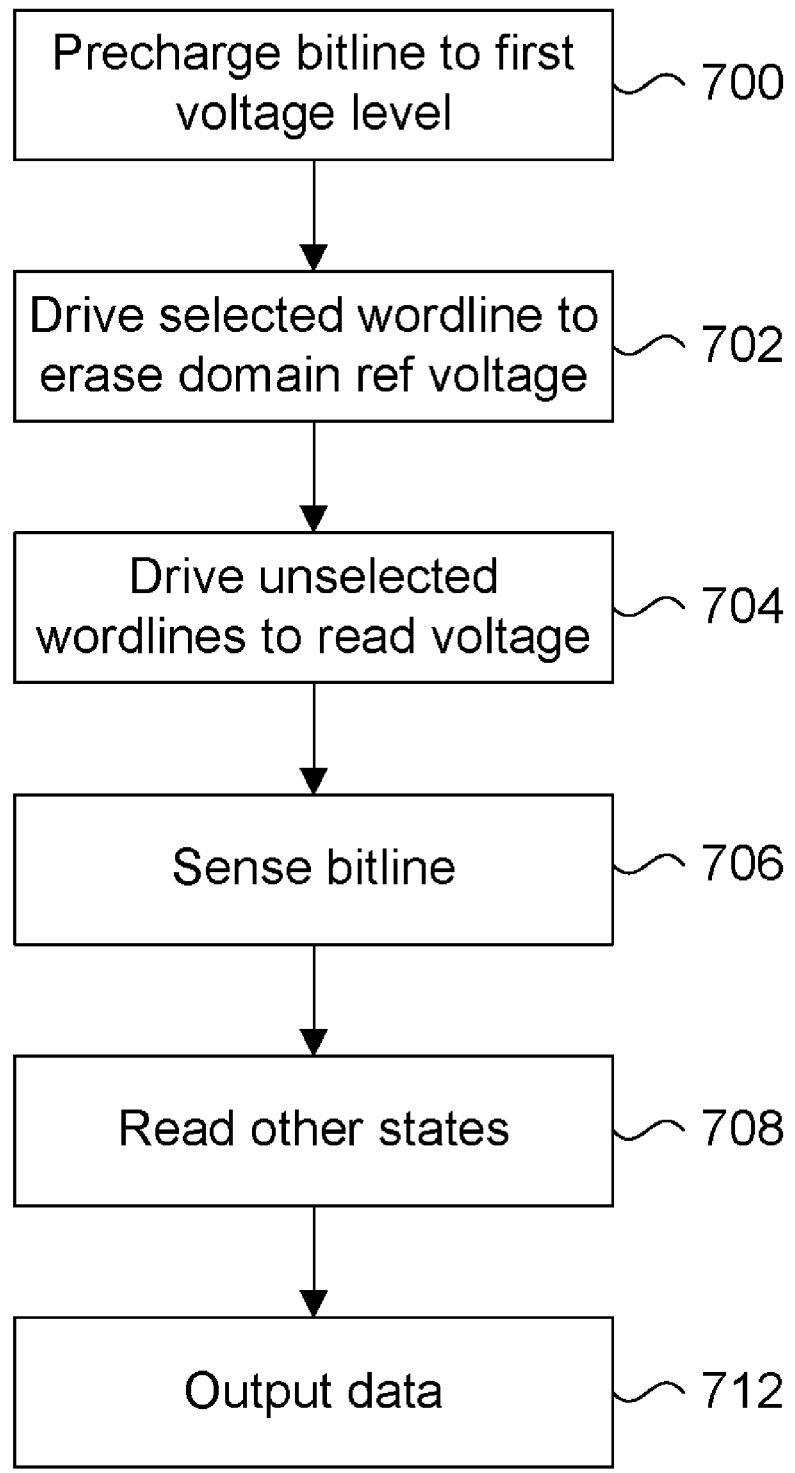

FIG. 15 is a flow chart of a method for reading one cell state in the erase voltage domain. The method starts at step 700 by precharging the bitlines to a first voltage level, such as a positive voltage level for example. The selected wordline is driven to an erase voltage domain reference voltage at step 702, while the remaining unselected wordlines are driven to a read voltage at step 704. In the presently described example, the erase voltage domain reference voltage is selected to be lower than the desired threshold voltage range of the currently programmed state, but higher than the adjacent state having a lower threshold voltage range. In the example of FIG. 8, if the programmed state being read is cell state 1, then the erase voltage domain reference voltage is selected to be Vref1-rd. The read voltage is typically a program voltage domain voltage sufficient to turn on a memory cell having the highest programmed threshold voltage, such as Vread in the example of FIG. 8. The bitline is sensed at step 706 to determine if the cell threshold voltage is either greater than or less than Vref1-rd, and the states of the bits are updated. At step 708, the remaining states are sensed to complete the read operation for the memory cell. The remaining states can be further erase voltage domain states and program voltage domain states. In otherwords, the read process will repeat with the updated parameters corresponding to the state being sensed, ie, setting the reference voltage to Vref2-rd at step 700. Once all the possible states stored in the Flash memory cell are sensed, the multi-bit logic states corresponding to the threshold level stored in the memory cell are output through read path circuits at step 710.

Therefore, by programming at least one state in the erase voltage domain as previously described by the embodiments of the present invention, reliability or endurance of a multi-level Flash memory device is maximized relative to prior art multi-level Flash memory devices because the Vt window for each cell state is minimized while the Vt distance between cell states is maximized. Alternately, the Vt window for each cell state can be relaxed, thereby increasing ISPP programming speed relative to prior art multi-level Flash memory devices as the step sizes are increased and number of steps are decreased. Those skilled in the art will understand that optimization of the Vt window and Vt distance will be tailored for the specific application of the multi-level Flash memory device.

The above-described embodiments of the present invention are intended to be examples only. Alterations, modifications and variations may be effected to the particular embodiments by those of skill in the art without departing from the scope of the invention, which is defined solely by the claims appended hereto.

For example, the erase voltage domain is described in the example embodiments as being voltages less than 0V while the program voltage domain include voltages greater than 0V. In an alternate embodiment, the threshold voltage distribution scheme can be inverted, such that the erase voltage domain includes voltages greater than 0V while the program voltage domain includes voltages less than 0V.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

Embodiments of the invention can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention can also be stored on the machine-readable medium. Software running from the machine-readable medium can interface with circuitry to perform the described tasks.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A Flash memory device comprising:
a memory array having at least one memory cell programmable to have one of a first cell state, a second cell state, and an erase state,
the first cell state corresponding to a first programmed state and having a first threshold voltage in a first threshold voltage range between a lower voltage limit having a negative voltage and an upper voltage limit having a positive voltage,
the second cell state corresponding to a second programmed state and having a second threshold voltage within a second threshold voltage range lower than the first threshold voltage range,
the erase state having an erase threshold voltage range lower than the second threshold voltage range.

2. The Flash memory device of claim 1, wherein the at least one memory cell is programmable to a third programmed state having a third threshold voltage range higher than the first threshold voltage range.

* * * * *